(12) United States Patent
Habib et al.

(10) Patent No.: US 12,614,921 B2
(45) Date of Patent: Apr. 28, 2026

(54) PASSIVE ELEMENT-THYRISTOR PARALLEL CONNECTION FOR MITIGATING INRUSH CURRENT IN STATIC TRANSFER SWITCH

(71) Applicant: ABB Schweiz AG, Baden (CH)

(72) Inventors: Hany Habib, Richmond, VA (US); Thomas Anthony Kendzia, III, Richmond, VA (US); Veerakumar Bose, Richmond, VA (US); Christopher Alan Belcastro, Richmond, VA (US)

(73) Assignee: ABB Schweiz AG, Baden (CH)

( * ) Notice: Subject to any disclaimer, the term of this patent is extended or adjusted under 35 U.S.C. 154(b) by 15 days.

(21) Appl. No.: 18/535,357

(22) Filed: Dec. 11, 2023

(65) Prior Publication Data

US 2025/0192606 A1 Jun. 12, 2025

(51) Int. Cl.
*H02J 9/06* (2006.01)
*H02J 3/007* (2026.01)
*H03K 17/082* (2006.01)

(52) U.S. Cl.
CPC .............. *H02J 9/068* (2020.01); *H02J 3/007* (2020.01); *H02J 9/062* (2013.01); *H03K 17/0824* (2013.01)

(58) Field of Classification Search
CPC .......... H02J 9/068; H02J 3/007; H02J 9/062; H03K 17/0824
USPC ......................................................... 307/86
See application file for complete search history.

(56) References Cited

U.S. PATENT DOCUMENTS

| | | | | |
|---|---|---|---|---|
| 6,051,893 A | * | 4/2000 | Yamamoto | H02J 9/06 |
| | | | | 307/64 |
| 11,211,816 B1 | * | 12/2021 | Bose | H03K 17/0403 |
| 2021/0273440 A1 | * | 9/2021 | Kang | H01L 21/67 |

FOREIGN PATENT DOCUMENTS

| | | | |
|---|---|---|---|
| CN | 114944297 A | | 8/2022 |
| EP | 3591782 B1 | | 5/2021 |
| JP | 2003235160 | * | 8/2003 |
| WO | WO2023027803 | * | 3/2023 |

OTHER PUBLICATIONS

Chang et al., Voltage quality enhancement with power electronics based devices. 2000 IEEE Power Engineering Society Winter Meeting. pp. 2937-2942, Jan. 23-27, 2000.
International Search Report and Written Opinion for Application No. PCT/US2024/059153, dated Mar. 18, 2025, 16 pages.

\* cited by examiner

*Primary Examiner* — Richard Tan
(74) *Attorney, Agent, or Firm* — McCarter & English, LLP

(57) ABSTRACT

Disclosed herein is a static transfer switch and methods of operating the same. The static transfer switch includes a first switch between a first voltage source and a load, and a second switch between a second voltage source and the load. The first switch and the second switch are configured to alternate power to the load between the first voltage source or the second voltage source. The static transfer switch also includes a first parallel circuit branch coupled in parallel to the first switch, the first parallel circuit branch comprising a first passive element and a first auxiliary switch.

16 Claims, 4 Drawing Sheets

PASSIVE ELEMENT-THYRISTOR PARALLEL CONNECTION FOR MITIGATING INRUSH CURRENT IN STATIC TRANSFER SWITCH

FIELD OF THE DISCLOSURE

The present disclosure relates generally to static transfer switches. In particular, the present disclosure relates to mitigating inrush current in a static transfer switch (STS), using a passive element and thyristor coupled in parallel to the STS.

BACKGROUND

A static transfer switch (STS) is a device used to switch from a primary voltage source to an alternate voltage source, and vice versa, when the primary voltage source is unable to power a load. STSs are often implemented in mission critical environments, such as data centers, in which it is important that a back-up power source be available in case a primary power source is unavailable or degraded to a level unsuitable to power a load. In at least some instances, an STS includes high-power solid-state switches, such as thyristors. These switches can be vulnerable to damage by inrush current, which can be experienced during a start-up process and/or during a voltage source transfer. Some methods for preventing this damage include positioning a circuit breaker upstream of the switches, which trips when inrush current exceeds a threshold that could damage the switch. However, these designs can be costly because the circuit breaker must be matched to the current rating of the downstream switch. Moreover, these known solutions for protecting switches from inrush current incur downtime to reset the tripped circuit breaker(s).

BRIEF DESCRIPTION

According to one aspect, a static transfer switch includes a first switch between a first voltage source and a load, and a second switch between a second voltage source and the load. The first switch and the second switch are configured to alternate power to the load between the first voltage source or the second voltage source. The static transfer switch also includes a first parallel circuit branch coupled in parallel to the first switch, the first parallel circuit branch comprising a first passive element and a first auxiliary switch.

According to another aspect, a method of operating a static transfer switch includes coupling a first switch between a first voltage source and a load, and coupling a second switch between a second voltage source and the load, wherein the first switch and the second switch are configured to alternate power to the load between the first voltage source or the second voltage source. The method also includes coupling a first parallel circuit branch in parallel to the first switch, the first parallel circuit branch including a first passive element and a first auxiliary switch. The method further includes closing the first auxiliary switch to conduct current from the first voltage source through the first parallel circuit branch until the first voltage source is ON, and, when the first voltage source is ON, closing the first switch to conduct current through the first switch to power the load using the first voltage source.

The foregoing and other aspects, features, details, utilities, and advantages of the present disclosure will be apparent from reading the following description and claims, and from reviewing the accompanying drawings.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of this disclosure. These features are believed to be applicable in a wide variety of systems comprising one or more embodiments of this disclosure. As such, the drawings are not meant to include all conventional features known by those of ordinary skill in the art to be required for the practice of the embodiments disclosed herein.

DETAILED DESCRIPTION OF THE DISCLOSURE

The present disclosure is directed a static transfer switch (STS) including parallel circuit branches across the main thyristor switches. These parallel circuit branches include passive elements and auxiliary switches, which are closed during start-up and voltage source transfer to mitigate inrush current to the main switches. These parallel circuit branches are compact and cost-effect relative to other contemplated solutions to the above-references limitations of conventional STSs.

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Figure 1:
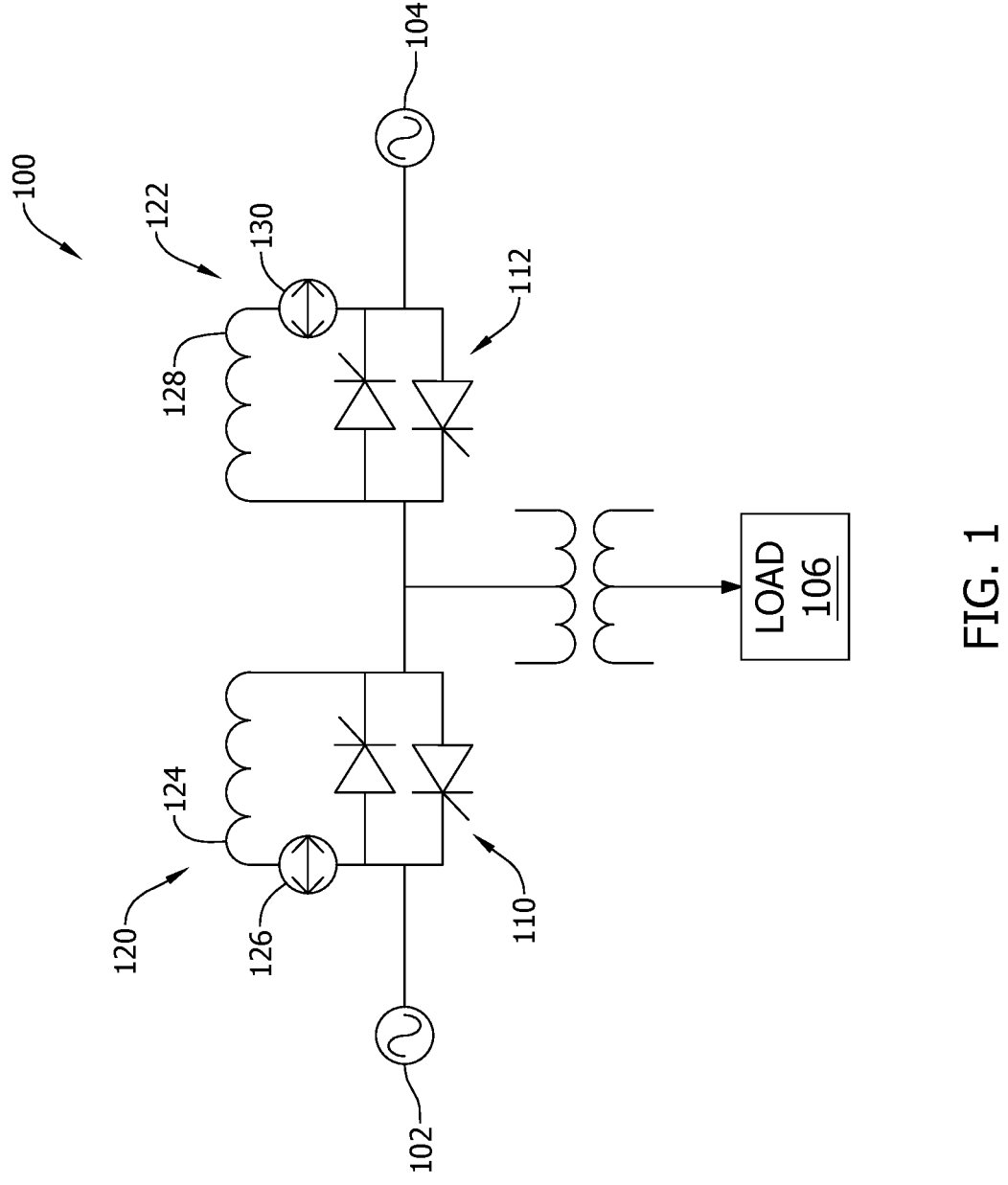
FIG. 1 is a schematic diagram of a static transfer switch (STS) in accordance with the present disclosure.

Turning now to the figures, FIG. 1 is a schematic diagram of a static transfer switch (STS) 100. STS 100 is used to switch from a first voltage source 102 to a second voltage source 104, and vice versa, to power a load 106. STS 100 includes a first switch 110, also referred to as a first SCR (silicon-controlled rectifier), coupled in series between first voltage source 102 and load 106. First SCR 110 includes, for example, a pair of thyristor switches. STS 100 also includes a second switch 112, also referred to as a second SCR, coupled in series between second voltage source 104 and load 106. Second SCR 112 includes, for example, a pair of thyristor switches. First SCR 110 and second SCR 112 are configured to alternate power to load 106 between first voltage source 102 or the second voltage source 104, respectively.

During a load start-up process, or during a voltage source transfer between first voltage source 102 and second voltage source 104 powering load 106, inrush current can damage SCRs 110, 112 or load 106. As described above, conventional solutions to avoid such damage include circuit breakers that trip to prevent high magnitude inrush current being conducted through SCRs 110, 112.

STS 100 of the present disclosure instead includes a parallel circuit branch in connection with each SCR 110, 112. In particular, a first parallel circuit branch 120 is connected in parallel with first SCR 110, and a second parallel circuit branch 122 is connected in parallel with second SCR 112. First parallel circuit branch 120 includes a passive element 124 and a first auxiliary switch 126, which is also referred to herein as an auxiliary SCR, and, likewise, second parallel circuit branch includes a passive element 128 and a second auxiliary switch 130.

Passive elements 124 and 128 each include a resistance element (e.g., a resistor) or an inductance element (e.g., an inductor). In some embodiments, passive elements 124 and 128 are the same type of passive elements (e.g., both include a resistor, or both include an inductor). In some embodiment, passive elements 124 and 128 are different types of passive elements (e.g., one is a resistor and one is an inductor).

Auxiliary SCR 126, 130 is any switching element, such as a semiconductor switch (e.g., IGBT, MOSFET, etc.) or, in alternative embodiments, an electromechanical switch (e.g., for use during startup processes). In the example embodiment, auxiliary SCR 126 is a smaller and/or more cost effective switch component than SCR 110, 112, such as PCB-mounted component.

In the example embodiment, STS 100 is activated during a start-up process of load 106, to mitigate inrush current during start up. Additionally, STS 100 is activated during a voltage source transfer between sources 102, 104. In particular, as described further herein, parallel circuit branch 120 or 122 is activated (e.g., auxiliary switch 126 or auxiliary switch 130 is closed) to mitigate the inrush current being conducted through switches (SCRs) 110, 112 during start up or transfer.

Figure 2:
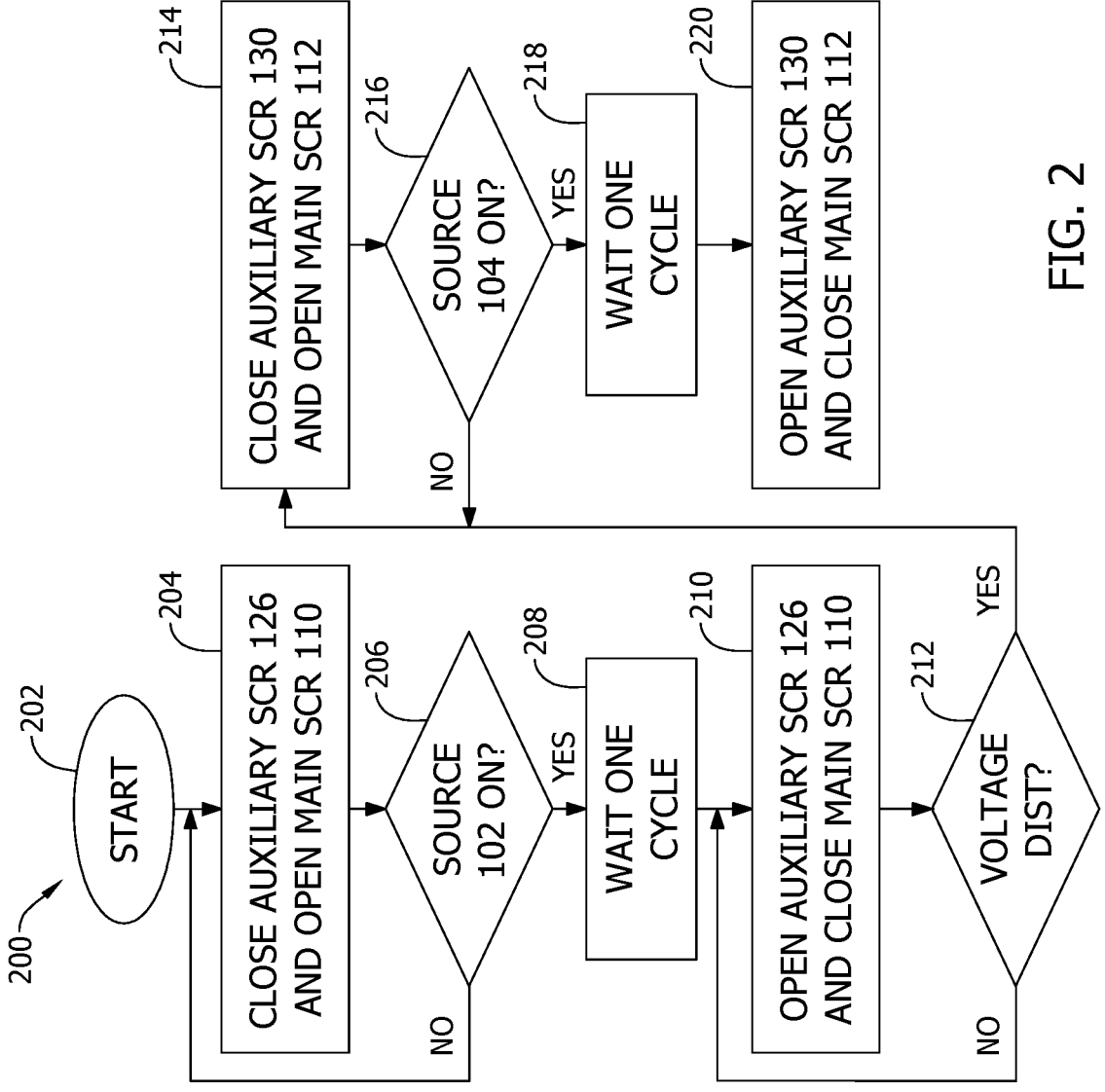
FIG. 2 is a flow diagram of operational logic for controlling an STS, such as the STS shown in FIG. 1.

With reference to FIGS. 1 and 2, a flow diagram of operational logic 200 of STS 100 is further described. Operational logic 200 is exercised at start up of load 106 and further enables power transfer between voltage sources 102, 104 during operation of load 106.

Upon start-up (202), first auxiliary SCR 126 is closed and first SCR 110 is opened (204). Current conducts through first passive element 124 and first auxiliary SCR 126. If first voltage source 102 is ON (206), operational logic 200 proceeds. Otherwise, first SCR 110 remains open (204) until first voltage source is ON. One cycle of time elapses (208). The cycle of time is programmable or adjustable based upon the particular application of STS 100 and should not be construed in a limiting manner. First auxiliary SCR 126 is opened and first SCR 110 is closed (210), such that first SCR 110 is conducting current therethrough to enable powering of load 106 using first voltage source 102. Load 106 is powered using first voltage source 102 in the absence of any voltage disturbance.

Upon detection of a voltage disturbance (212), representing a loss in quality of power being provided by first voltage source 102, a voltage source transfer from first voltage source 102 to second voltage source 104 is initiated. Second auxiliary SCR 130 is closed and second SCR 112 remains open (214). Current conducts through second passive element 128 and second auxiliary SCR 130. If second voltage source 104 is ON (216), operational logic 200 proceeds. Otherwise, second SCR 112 remains open (216) until second voltage source 104 is ON. One cycle of time elapses (218). The cycle of time is programmable or adjustable based upon the particular application of STS 100 and should not be construed in a limiting manner. Notably, the cycle of time that elapses (218) after second voltage source 104 is turned on may be different from the cycle of time that elapses (208) after first voltage source 102 is turned on.

Second auxiliary SCR 130 is opened and second SCR 112 is closed (220), such that second SCR 112 is conducting current therethrough to enable powering of load 106 using second voltage source 104. Load 106 is disconnected from first voltage source 102 and is powered using second voltage source 104 in the absence of any voltage disturbance or until first voltage source 102 is returned to appropriate functionality, in which case operational logic 200 is reversed to return powering of load 106 to first voltage source 102.

Operational logic 200 is implemented, for example, using a control circuit or functional control layer on a PCB, which may include, for example, a microcontroller unit (MCU), a microprocessor, or any suitable processing and control component(s). The control circuit/layer may be implemented on load 106 or in an intermediate control device within a system containing load 106.

Figure 3:
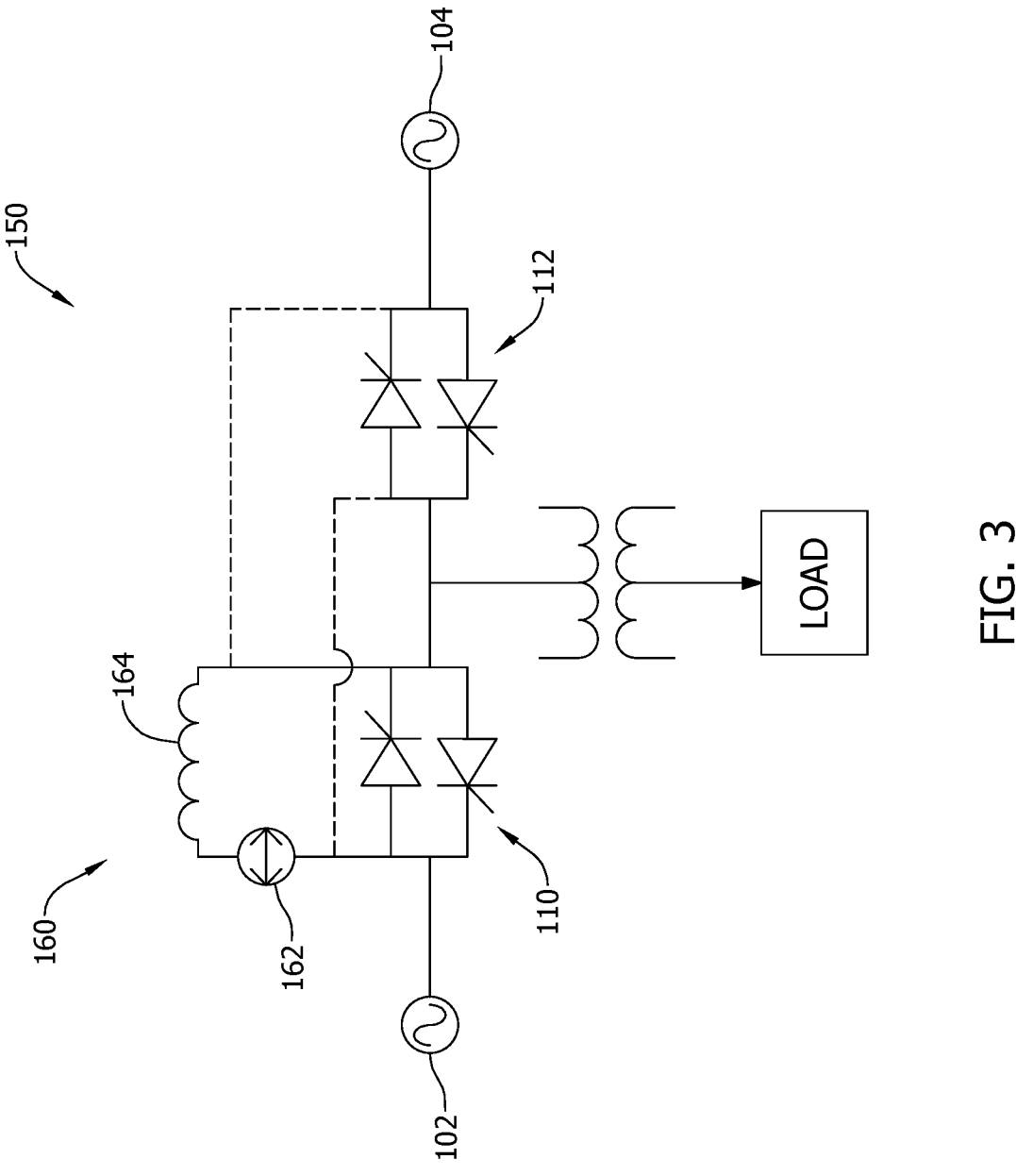
FIG. 3 is a schematic diagram of another embodiment of an STS in accordance with the presence disclosure.

FIG. 3 is a schematic diagram of an alternative embodiment of an STS 150. STS 150 is similar to STS 100 in many respects, and, therefore, like components may be referred to using like reference numerals.

As described above with respect to STS 100, STS 150 is used to switch from first voltage source 102 to second voltage source 104, and vice versa, to power load 106. STS 150 includes first SCR 110 and second SCR 112, which are configured to alternate power to load 106 between first voltage source 102 or the second voltage source 104, respectively.

STS 150 of the present disclosure instead includes a single parallel circuit branch 160 in connection with both SCRs 110, 112. Parallel circuit branch 160 is connected in parallel with first SCR 110 and with second SCR 112, and includes a passive element 164 and an auxiliary switch 162.

Passive element 164 each includes a resistance element (e.g., a resistor) or an inductance element (e.g., an inductor). Auxiliary switch 162 is any switching element, such as a semiconductor switch (e.g., IGBT, MOSFET, etc.) or, in alternative embodiments, an electromechanical switch (e.g., for use during startup processes).

In the example embodiment, STS 150 is activated during a start-up process of load 106, to mitigate inrush current during start up. Auxiliary switch 164 is closed to mitigate the inrush current being conducted through switches (SCRs) 110, 112, regardless of whether first voltage source 102 or second voltage source 104 is activated to power load 106.

It should be recognized that operational logic 200 applies to STS 150 in an abbreviated or simplified fashion during a start-up process. For example, corresponding to step 204, auxiliary switch 162 is closed. Depending on whether first voltage source 102 or second voltage source 104 is activated to power load 106, the corresponding one of first SCR 110 or second SCR 112 is opened. Corresponding to step 206, it is determined whether the one of first voltage source 102 or second voltage source 104 is ON. Corresponding to step 210, once the particular voltage source is ON and a cycle has elapsed (step 208), the corresponding one of first SCR 110 or second SCR 112 is closed, and auxiliary switch 162 is opened. The steps can be implemented as applicable during a voltage source transfer process as well.

Accordingly, STSs 100 and 150 each provide a reliable, compact, and cost-effective STS that solves some known disadvantages of STSs, as described herein. In particular, load 106 and SCRs 110, 112 are prevented from being damaged by mitigating the inrush current provided thereto, while eliminating circuit breakers or fuses.

Figure 4:
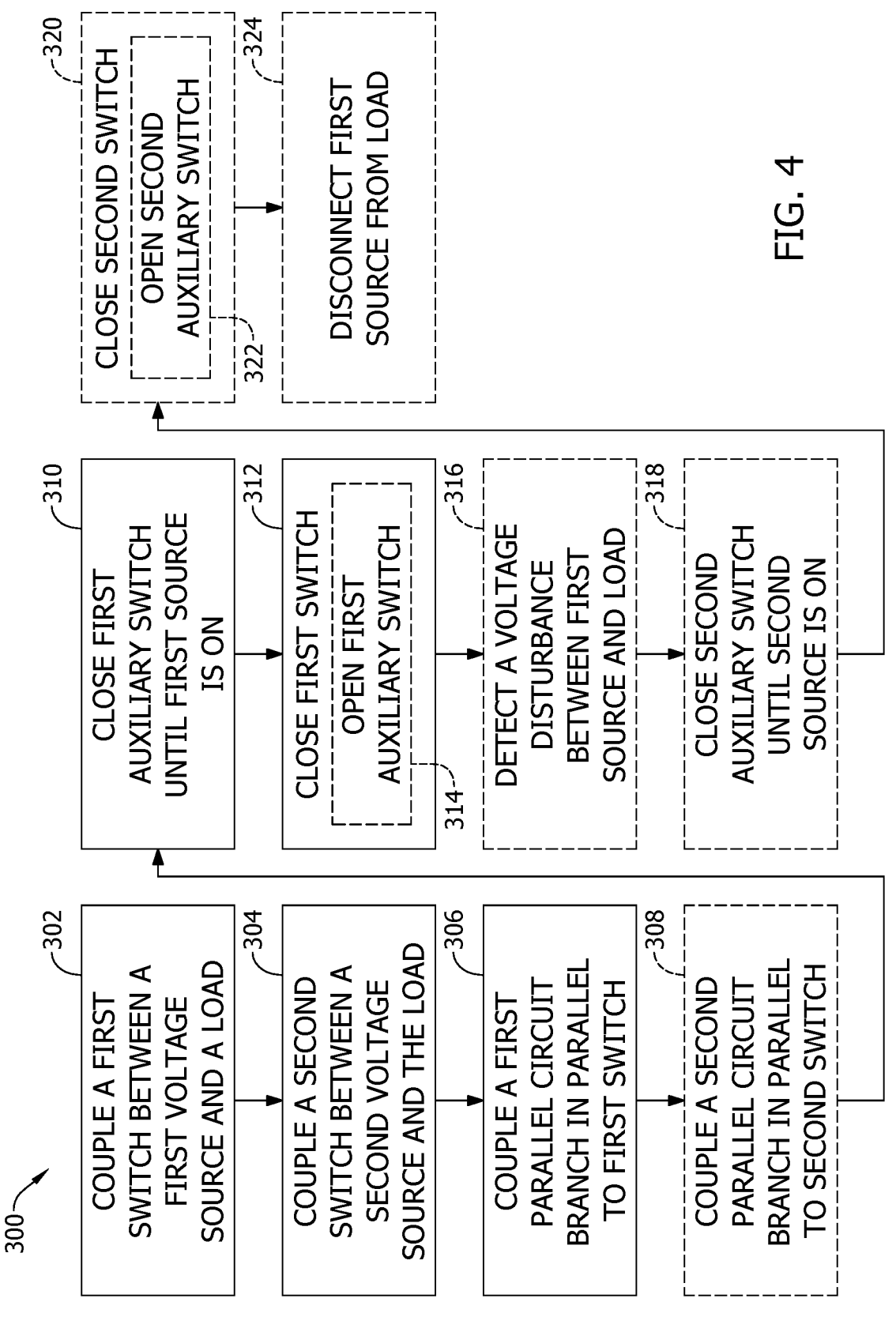
FIG. 4 is a flow diagram of a method of operating an STS, such as the STS shown in FIG. 1 and the STS shown in FIG. 3.

FIG. 4 is a flow diagram of a method 300 of operating an STS, such as STS 100 shown in FIG. 1 and/or STS 150 shown in FIG. 3. Method 300 includes coupling 302 a first switch between a first voltage source and a load and coupling 304 a second switch between a second voltage source and the load. The load is configured to be alternatively powered by the first voltage source or the second voltage source.

Method 300 also includes coupling 306 a first parallel circuit branch in parallel to the first switch, the first parallel circuit branch including a first passive element and a first auxiliary switch. In some embodiments, method 300 includes coupling 308 a second parallel circuit branch in parallel to the second switch, the second parallel circuit branch including a second passive element and a second auxiliary switch.

Method 300 includes closing 310 the first auxiliary switch to conduct current from the first voltage source through the first parallel circuit branch until the first voltage source is ON. In some embodiments, closing 310 is initiated upon start-up of the load.

Method 300 further includes, when the first voltage source is ON, closing 312 the first switch to conduct current through the first switch to power the load using the first voltage source. In some embodiments, method 300 includes opening 314 the first auxiliary switch during closing 312 the first switch. In some embodiments, closing 310 is initiated upon start-up of the load.

In some embodiments, method 300 further includes detecting 316 a voltage disturbance between the first voltage source and the load, closing 318 the second auxiliary switch to conduct current from the second voltage source through the second parallel circuit branch until the second voltage source is ON, and, when the second voltage source is ON, closing 320 the second switch to conduct current through the second switch to power the load using the second voltage source. In some embodiments, method 300 also includes opening 322 the second auxiliary switch during closing 320 the second switch. In some embodiments, method 300 also includes disconnecting 324 the first voltage source from the load.

Example embodiments of static transfer switches, as well as methods of operating the same, are described herein in detail. The circuits and methods are not limited to the specific embodiments described herein, but rather, components of systems and/or steps of the methods may be utilized independently and separately from other components and/or steps described herein. For example, the method may also be used in combination with other components and are not limited to practice only with the circuits as described herein.

Rather, the example embodiment can be implemented and utilized in connection with many other applications.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A static transfer switch comprising:
   a first silicon-controlled-rectifier-based (SCR-based) switch between a first voltage source and a load;
   a second SCR-based switch between a second voltage source and the load, wherein the first SCR-based switch and the second SCR-based switch are configured to alternate power to the load between the first voltage source and the second voltage source; and
   a first parallel circuit branch coupled in parallel to the first SCR-based switch, the first parallel circuit branch comprising a first inductor and a first auxiliary SCR-based switch, the first auxiliary SCR-based switch connected in series with the first inductor in the first parallel circuit branch,
   wherein the first auxiliary SCR-based switch is configured to be closed while the first SCR-based switch is open during activation of the first voltage source.

2. The static transfer switch of claim 1, further comprising a second parallel circuit branch coupled in parallel to the second SCR-based switch, the second parallel circuit branch comprising a second inductor and a second auxiliary SCR-based switch, the second auxiliary SCR-based switch connected in series with the second inductor in the second parallel circuit branch.

3. The static transfer switch of claim 2, wherein the second auxiliary SCR-based switch is closed while the second SCR-based switch is open during activation of the second voltage source.

4. The static transfer switch of claim 3, wherein the second auxiliary SCR-based switch is open while the second SCR-based switch is closed.

5. The static transfer switch of claim 1, wherein the first SCR-based auxiliary switch is open when the first SCR-based switch is closed.

6. The static transfer switch of claim 1, wherein the first parallel circuit branch is coupled in parallel to the first SCR-based switch and the second SCR-based switch.

7. The static transfer switch of claim 6, wherein the first auxiliary SCR-based switch is closed while one of the first SCR-based switch or the second SCR-based switch is open.

8. The static transfer switch of claim 7, wherein the first auxiliary SCR-based switch is open when the one of the first SCR-based switch or the second SCR-based switch is closed.

9. A method of operating a static transfer switch, the method comprising:

coupling a first silicon-controlled-rectifier-based (SCR-based) switch between a first voltage source and a load;

coupling a second SCR-based switch between a second voltage source and the load, wherein the first SCR-based switch and the second SCR-based switch are configured to alternate power to the load between the first voltage source and the second voltage source;

coupling a first parallel circuit branch in parallel to the first SCR-based switch, the first parallel circuit branch including a first inductor and a first auxiliary SCR-based switch, the first auxiliary SCR-based switch connected in series with the first inductor in the first parallel circuit branch;

closing the first auxiliary SCR-based switch to conduct current through the first parallel circuit branch during activation of the first voltage source until the first voltage source is ON; and when the first voltage source is ON, closing the first SCR-based switch to conduct current through the first SCR-based switch to power the load using the first voltage source.

10. The method of claim 9, wherein said closing the first auxiliary SCR-based switch is initiated upon start-up of the load.

11. The method of claim 9, further comprising opening the first auxiliary SCR-based switch during said closing the first SCR-based switch.

12. The method of claim 9, further comprising:

coupling a second parallel circuit branch in parallel to the second SCR-based switch, the second parallel circuit branch including a second inductor and a second auxiliary SCR-based switch, the second auxiliary SCR-based switch connected in series with the second inductor in the second parallel circuit branch.

13. The method of claim 12, further comprising:

detecting a voltage disturbance between the first voltage source and the load;

closing the second auxiliary SCR-based switch to conduct current through the second parallel circuit branch during activation of the second voltage source until the second voltage source is ON; and when the second voltage source is ON, closing the second SCR-based switch to conduct current through the second SCR-based switch to power the load using the second voltage source.

14. The method of claim 13, further comprising disconnecting the first voltage source from the load.

15. The method of claim 13, further comprising opening the second auxiliary SCR-based switch during said closing the second SCR-based switch.

16. The method of claim 9, wherein coupling the first parallel circuit branch in parallel to the first SCR-based switch further comprises coupling the first parallel circuit branch in parallel to the second SCR-based switch.

* * * * *